US012812985B2

(12) United States Patent
Wada et al.

(10) Patent No.: US 12,812,985 B2
(45) Date of Patent: Nov. 24, 2026

(54) DETECTOR COMPRISING INSULATOR REGION AND DETECTION SYSTEM

(71) Applicant: CANON KABUSHIKI KAISHA, Tokyo (JP)

(72) Inventors: Zempei Wada, Saitama (JP); Takanori Watanabe, Kanagawa (JP); Kazutaka Osawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 405 days.

(21) Appl. No.: 18/423,473

(22) Filed: Jan. 26, 2024

(65) Prior Publication Data

US 2024/0266458 A1 Aug. 8, 2024

(30) Foreign Application Priority Data

Feb. 8, 2023 (JP) ................................ 2023-017435

(51) Int. Cl.
*H10F 30/221* (2025.01)
*H04N 25/63* (2023.01)
*H10F 39/00* (2025.01)

(52) U.S. Cl.
CPC ........... *H10F 30/221* (2025.01); *H04N 25/63* (2023.01); *H10F 39/802* (2025.01)

(58) Field of Classification Search
None
See application file for complete search history.

(56) References Cited

U.S. PATENT DOCUMENTS 6,590,242 B1 7/2003 Kozuka et al.
6,649,951 B2 11/2003 Kozuka et al.
7,235,831 B2 6/2007 Kozuka et al.
8,736,008 B2 5/2014 Li et al.
10,535,693 B2 * 1/2020 Roy ...................... H10F 39/014
2004/0188728 A1 9/2004 Grant
2008/0230817 A1 * 9/2008 Yasukawa ............... H10F 30/21 257/E27.128

(Continued)

FOREIGN PATENT DOCUMENTS

DE 10 2012 113 168 A1 7/2013
JP 2004-312039 A 11/2004

OTHER PUBLICATIONS

Examination Report in German Application No. 10 2024 103 380.0 (Jun. 2026).

(Continued)

*Primary Examiner* — Nduka E Ojeh
(74) *Attorney, Agent, or Firm* — Venable LLP

(57) ABSTRACT

A detector includes a substrate and an insulating film formed over a main surface of the substrate. The substrate includes a conversion element portion and an insulator region disposed in a recess portion of the main surface. The conversion element portion includes a first semiconductor region that is formed on the main surface and is of a first conductivity type, a second semiconductor region that is formed on the main surface and is of a second conductivity type, and a third semiconductor region that is formed under the first semiconductor region and the second semiconductor region and is of the first conductivity type. In a plan view with respect to the main surface, the insulator region is located between the first semiconductor region and the second semiconductor region in at least one direction.

16 Claims, 9 Drawing Sheets

(56) References Cited

U.S. PATENT DOCUMENTS

| | | | | |
|---|---|---|---|---|
| 2009/0127435 | A1* | 5/2009 | Mochizuki | H10D 86/00<br>250/208.1 |
| 2010/0193845 | A1* | 8/2010 | Roy | H10F 39/807<br>257/E27.15 |
| 2017/0345857 | A1 | 11/2017 | Suzuki et al. | |
| 2019/0237499 | A1* | 8/2019 | Roy | H04N 25/76 |
| 2019/0280024 | A1* | 9/2019 | Roy | H10F 39/199 |
| 2021/0364604 | A1* | 11/2021 | Isogai | G01S 17/08 |
| 2022/0026542 | A1* | 1/2022 | Morimoto | G01S 7/4863 |

OTHER PUBLICATIONS

S. Rizzolo et al., "Partially Pinned Photodiode Performances for Emerging Space and Nuclear Applications," Int. Image Sensors Society, R.48, pp. 1-4 (Jun. 2019).

Vincent Goiffon, "Radiation Effects on CMOS Active Pixel Image Sensors," in Ionizing Radiation Effects in Electronics, Chapter 11, pp. 295-332 (2016).

Serena Rizzolo et al, "Radiation Hardness Comparison of CMOS Image Sensor Technologies at High Total Ionizing Dose Levels," 66(1) IEEE Trans. Nucl. Sci. (Jan. 2019).

* cited by examiner

A-A′

B-B′

DETECTOR COMPRISING INSULATOR REGION AND DETECTION SYSTEM

BACKGROUND OF THE INVENTION

Field of the Invention

The present invention relates to a detector that detects an energy ray such as radiation or light, and a detection system including the detector.

Description of the Related Art

As a detector capable of detecting energy rays such as visible light and X-rays, a detector having a pixel structure of a complementary metal oxide semiconductor (CMOS) sensor is known. JP 2004-312039 A describes a photoelectric conversion element including a structure known as a buried photodiode in which a charge generation region for converting light into a charge is buried in a substrate. The photoelectric conversion element includes the charge generation region of a first conductivity type, a semiconductor region of a second conductivity type covering the charge generation region, and an electrode region of the same conductivity type as the charge generation region and having an impurity concentration higher than that of the charge generation region.

However, when the detector is exposed to radiation, defects in an insulating film increase due to a total dose effect of the radiation. In the structure described in JP 2004-312039 A, the semiconductor region of the second conductivity type and the electrode region of the first conductivity type are adjacent to each other on the surface of the substrate, and a depletion layer spreading from PN junction therebetween is in contact with the insulating film. Therefore, when defects in the insulating film increase due to radiation exposure, a dark current generated from an interface between the depletion layer and the insulating film may increase.

SUMMARY OF THE INVENTION

According to one aspect of the invention, a detector includes a substrate, and an insulating film formed over a main surface of the substrate, wherein the substrate includes a conversion element portion configured to convert an energy ray into a signal charge, and an insulator region disposed in a recess portion of the main surface, wherein the conversion element portion includes a first semiconductor region that is formed on the main surface and is of a first conductivity type in which charges of the same polarity as the signal charge are used as majority carriers, a second semiconductor region that is formed on the main surface and is of a second conductivity type different from the first conductivity type, and a third semiconductor region that is formed under the first semiconductor region and the second semiconductor region, is of the first conductivity type, and has an impurity concentration lower than an impurity concentration of the first semiconductor region, and wherein in a plan view with respect to the main surface, the insulator region is located between the first semiconductor region and the second semiconductor region in at least one direction.

Further features of the present invention will become apparent from the following description of exemplary embodiments with reference to the attached drawings.

DESCRIPTION OF THE EMBODIMENTS

Figure 1A:
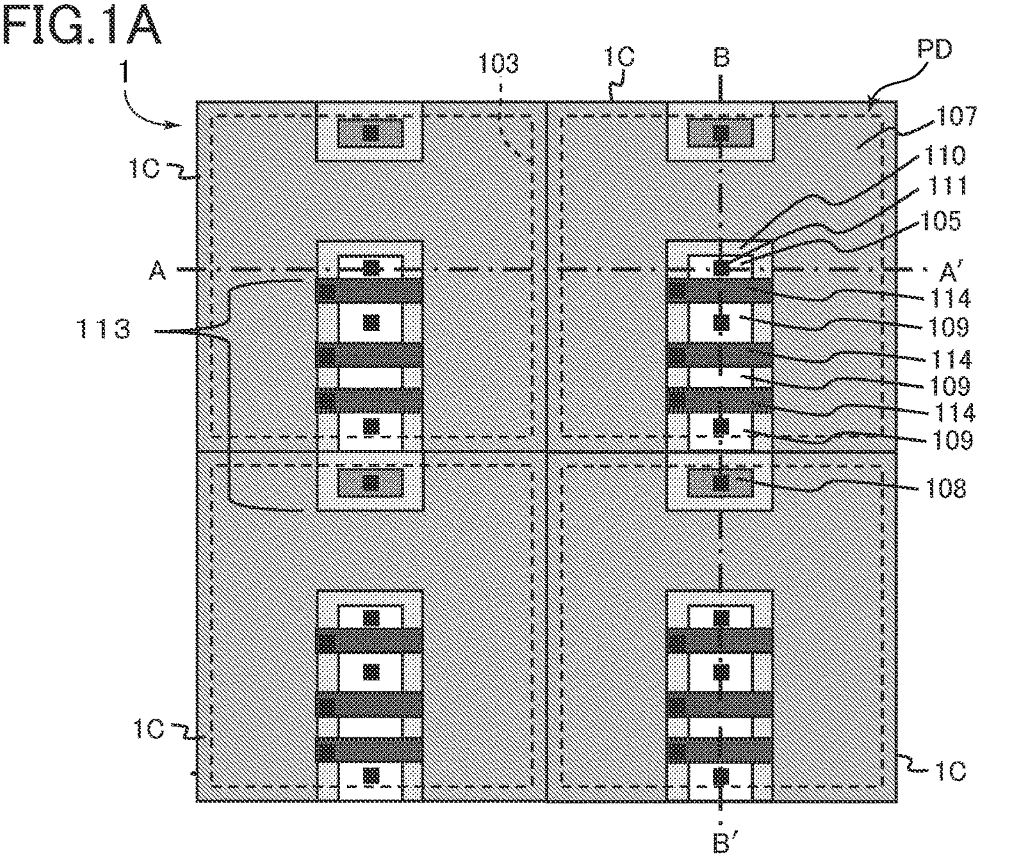
FIG. 1A is a plan view illustrating a pixel structure according to a first embodiment.

Hereinafter, embodiments according to the present disclosure will be described with reference to the drawings. In the drawings, the same components are denoted by the same reference numerals.

In the present disclosure, an "energy ray" detected by the detector may be any of an electromagnetic wave (non-ionizing radiation) such as visible light or infrared light, a high energy electromagnetic wave (electromagnetic radiation) such as an X-ray or a gamma ray, or a particle ray (particle radiation) such as an α ray, a β ray, or an electron beam. That is, the "detector" of the present disclosure may be a radiation detector that mainly detects radiation, or may be a photodetector that mainly detects light. Even in the case of a photodetector, when the photodetector is used in an environment (for example, space or a nuclear power facility) exposed to radiation, an increase in dark current noise due to radiation exposure may occur.

In each of the following embodiments, a case where electrons are used as signal charges will be described. However, in a case where holes are used as signal charges, a P-type semiconductor region may be replaced with an N-type semiconductor region, and the N-type semiconductor region may be replaced with the P-type semiconductor region.

In addition, a semiconductor in which charges of the same polarity as the signal charges are used as majority carriers will be described as "first conductivity type", and a semiconductor having charges of the opposite polarity to the signal charges are used as majority carriers will be described as "second conductivity type". The N-type semiconductor in each of the following embodiments is an example of a first conductivity type semiconductor, and the P-type semiconductor is an example of a second conductivity type semiconductor. However, when holes are used as signal charges, the P-type semiconductor may be used as the first conductivity type, and an N-type semiconductor may be used as the second conductivity type.

First Embodiment

Figure 1B:
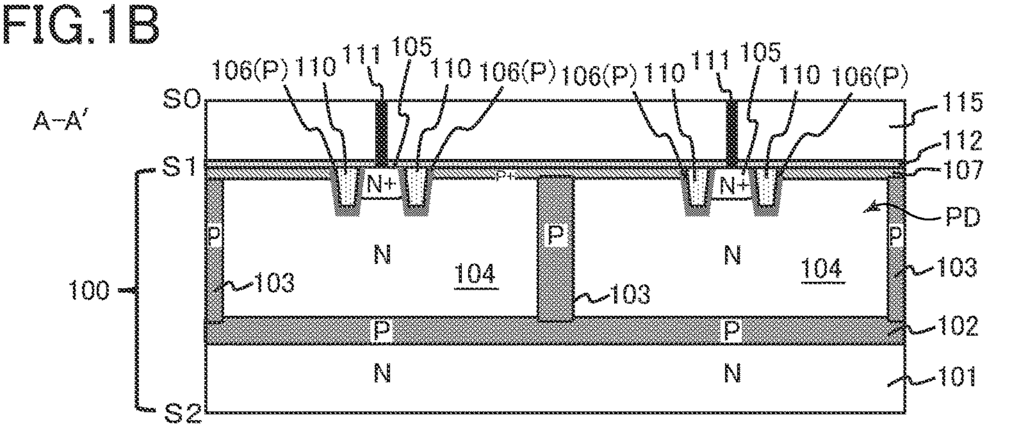
FIG. 1B is a cross-sectional view illustrating the pixel structure according to the first embodiment.
Figure 1C:
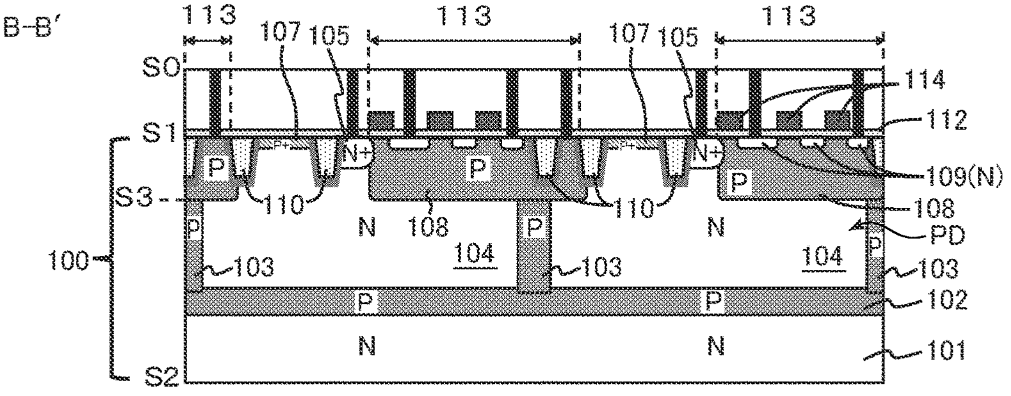
FIG. 1C is a cross-sectional view illustrating the pixel structure according to the first embodiment.

A pixel structure of an imaging device 1 as a detector according to a first embodiment will be described with reference to FIGS. 1A to 1C. FIG. 1A is a plan view illustrating a planar layout of pixels 1C included in the imaging device 1. Note that the imaging device 1 includes a pixel region in which a plurality of pixels 1C is arranged in a two-dimensional matrix, and FIG. 1A illustrates 2×2 pixels 1C. Furthermore, the plan view is a view seen in a direction perpendicular to a main surface of a substrate 100 having the pixel 1C. FIG. 1B is a cross-sectional view taken along line A-A' of FIG. 1A. FIG. 1C is a cross-sectional view taken along line B-B' of FIG. 1A.

Note that, in FIGS. 1A to 1C, a structure up to a surface S0 of an interlayer insulating film 115 in the imaging device 1 is illustrated, and a structure (wiring layer or the like) on a surface layer side of the surface S0 is omitted. Further, in FIG. 1A, a gate oxide film 112 and an interlayer insulating film 115 are omitted.

As illustrated in FIGS. 1A to 1C, the imaging device 1 includes the substrate 100, the gate oxide film 112 covering a front surface S1 of the substrate 100, and the interlayer insulating film 115 formed above the gate oxide film 112. The gate oxide film 112 is an insulating film formed over the front surface S1 of the substrate 100.

As illustrated in FIGS. 1B and 1C, a first main surface of substrate 100 is defined as the front surface S1, and a second main surface of substrate 100 opposite to the first main surface is defined as a back surface S2. Hereinafter, in the direction perpendicular to the main surface of the substrate 100, a direction from the back surface S2 toward the front surface S1 is referred to as an "upper side" or "above", and a direction from the front surface S1 toward the back surface S2 is referred to as a "lower side" or "under".

The substrate 100 is a substrate made of a semiconductor such as silicon, but may have an insulator region or the like formed integrally with the semiconductor substrate as in an insulator region 110 described below. In the present embodiment, the substrate 100 is an N-type silicon substrate. Furthermore, the imaging device 1 of the present embodiment is configured such that energy rays to be detected are emitted from a source on the front surface S1 side of the substrate 100.

As illustrated in FIGS. 1A to 1C, the substrate 100 includes a charge generation region 104, a charge collection region 105, an insulator region 110, P-type semiconductor regions 103 and 107, a P-type semiconductor layer 102, an N-type semiconductor layer 101, and a transistor region 113. The charge generation region 104, the charge collection region 105, and the P-type semiconductor region 107 constitute a conversion element portion PD that converts an energy ray to be detected into a signal charge.

The P-type semiconductor layer 102 is formed above the N-type semiconductor layer 101. In the present embodiment, a charge generated in a region shallower than the P-type semiconductor layer 102 in the substrate 100 can be treated as the signal charge. The depth at which the P-type semiconductor layer 102 is formed can be appropriately changed according to the property of the energy ray to be detected.

The P-type semiconductor region 103 extends in a thickness direction of the substrate 100 so as to separate the charge generation regions 104 between the adjacent pixels 1C and 1C. A potential barrier formed by the P-type semiconductor region 103 can prevent a crosstalk in which the signal charge generated in the charge generation region 104 of a certain pixel 1C from being mixed into the adjacent pixel 1C. When the crosstalk falls within the allowable range, the P-type semiconductor region 103 can be omitted. Furthermore, instead of the P-type semiconductor region 103, an insulator region (element isolation region) separating the pixels 1C from each other may be formed.

The charge generation region 104 is an example of a semiconductor region (third semiconductor region) that converts the energy ray into the signal charge. The charge generation region 104 is formed under the charge collection region 105 (first semiconductor region) and the P-type semiconductor region 107 (second semiconductor region). In addition, the charge generation region 104 is a region that is of the first conductivity type (N type) and has a lower impurity concentration than the charge collection region 105 (first semiconductor region).

The charge generation region 104 is preferably surrounded by a P-type (second conductivity type) semiconductor region and/or an insulator in the thickness direction of the substrate 100 and in-plane directions along the front surface S1 of the substrate 100. The charge generation region 104 of the present embodiment is formed above the P-type semiconductor layer 102 and under the charge collection region 105, the P-type semiconductor region 107, the insulator region 110, and a P-type well region 108 of the transistor region 113. That is, the charge generation region 104 is not exposed on the front surface S1 of the substrate 100 in a plan view. Furthermore, in the present embodiment, the periphery of the charge generation region 104 is surrounded by the P-type semiconductor region 103 in the in-plane directions along the front surface S1 of the substrate 100.

The charge collection region 105 is an example of a first semiconductor region of a first conductivity type (N type) formed on the front surface S1 (main surface) of the substrate 100. The charge collection region 105 is a semiconductor region having a conductivity type (N type) in which charges having the same polarity as the signal charge generated in the charge generation region 104 are majority carriers, and having an impurity concentration higher than that of the charge generation region 104. An implantation amount of impurities into the charge collection region 105 can be, for example, about $1\times10^{13}$ ions/cm$^3$ to about $1\times10^{14}$ ions/cm$^3$.

The signal charges generated in the charge generation region 104 are collected in the charge collection region 105 by a potential gradient caused by an impurity concentration difference between the charge generation region 104 and the charge collection region 105. The signal charge collected in the charge collection region 105 is read out to a readout circuit via a contact 111 in contact with the charge collection region 105. The contact 111 can be formed of a metal such as tungsten. Furthermore, the charge collection region 105 is shared as a source region or a drain region of a reset transistor to be described below that resets the signal charge of the charge generation region 104.

The P-type semiconductor region 107 is an example of a second semiconductor region of a second conductivity type (P-type) different from the first conductivity type, formed on the front surface S1 (main surface) of the substrate 100. The P-type semiconductor region 107 is a P-type region formed on the surface layer of the substrate 100 and having a high impurity concentration. An implantation amount of the impurity for forming the P-type semiconductor region 107 can be set to about $1\times10^{13}$ ions/$cm^3$ to about $1\times10^{14}$ ions/$cm^3$. The P-type semiconductor region 107 is a pinning layer fixed to a predetermined reference potential (ground potential).

The P-type semiconductor region 107 forms a PN junction with the N-type charge generation region 104. The pixel 1C of the present embodiment has a structure, as the conversion element portion PD that converts the energy ray into the charge (signal charge), of a buried photodiode in which the N-type charge generation region 104 is buried under the P-type semiconductor region 107. However, in the present disclosure, the "buried photodiode" is not necessarily limited to one that detects light, but means an element structure that converts an energy ray to be detected into a charge, and the energy ray may be a radiation.

As an advantage of the buried photodiode structure, since the charge generation region 104 is covered by the P-type semiconductor region 107, an area where the charge generation region 104 is in contact with the gate oxide film 112 is reduced. Therefore, the dark current generated at the interface between the charge generation region 104 and the gate oxide film 112 can be reduced.

The insulator region 110 is an insulator (element isolation structure) disposed in a recess portion on the front surface S1 (main surface) of the substrate 100. The insulator region 110 is, for example, a Shallow Trench Isolation (STI) region or a Local Oxidation of Silicon (LOCOS) region formed by a method such as STI or LOCOS. In the case of STI, oxide is embedded in a recess portion (trench) etched in a surface of a semiconductor wafer to be the substrate 100, and then the wafer surface is planarized by chemical mechanical polishing to form the insulator regions 110. In the case of LOCOS, the surface layer of the semiconductor wafer is locally thermally oxidized to form a structure in which the oxide enters the wafer surface in the depth direction in the insulator region 110. In this case, the recess portion of the substrate 100 in which the insulator region 110 is disposed means an interface with the oxide entering the wafer.

The insulator region 110 is disposed so as to surround at least a part of the periphery of the charge collection region 105 when viewed in a direction perpendicular to the main surface of the substrate 100 (that is, in a plan view) (FIG. 1B). Advantages of the above arrangement will be described below.

As illustrated in FIG. 1C, the transistor region 113 may be included in a region surrounded by the insulator region 110 in a plan view of the substrate 100. With this configuration, the insulator region 110 can have a function of separating an active region of the transistor region 113. The active region is a region in which a current flows during operation of the imaging device 1. In other words, in the configuration in which at least one transistor is disposed inside the charge generation region 104 (third semiconductor region) in a plan view, the charge collection region 105 (first semiconductor region) and the active region of the transistor can be disposed in a region separated from the P-type semiconductor region (second semiconductor region) by the insulator region 110.

The P-type semiconductor region 106 is a P-type (second conductivity type) semiconductor region (fourth semiconductor region) formed around the insulator region 110. For example, the P-type semiconductor region 106 can be formed along the surface of the recess portion by forming the recess portion on the surface of the semiconductor wafer by etching and then implanting P-type impurity ions at a high concentration. The implantation amount can be, for example, from $1\times10^{13}$ ions/$cm^3$ to $1\times10^{14}$ ions/$cm^3$. The P-type semiconductor region 106 is an impurity region (channel stopper layer) that suppresses a leakage current and increases a withstand voltage by reducing an area where the charge collection region 105 and the gate oxide film 112 are in contact with each other.

In addition, the impurity concentration of the P-type semiconductor region 106 is higher than the impurity concentration of the charge generation region 104 under the P-type semiconductor region 106. Therefore, it is possible to prevent a depletion layer spreading from the PN junction between the P-type semiconductor region 106 and the charge generation region 104 from coming into contact with the insulator region 110, and it is possible to suppress generation of a dark current due to a defect at the interface of the insulator region 110.

As will be described in the second embodiment, when a dark current due to a defect at the interface of the insulator region 110 is allowable, the P-type semiconductor region 106 may not be formed around the insulator region 110. For example, in the present embodiment, an example (FIG. 4) in which the readout circuit of the pixel 1C includes three transistors is described below, but a transfer transistor may be added to the readout circuit. In this case, the signal charge of the conversion element portion PD is transferred to a floating diffusion region (FD) by the transfer transistor, and a signal corresponding to an amount of charges of the floating diffusion region is output from the pixel 1C. In the case of the configuration including the transfer transistor as described above, since the signal charge is held in the floating diffusion region for a very short time, it is not necessary to provide the P-type semiconductor region 106 at the interface of the insulator region adjacent to the floating diffusion region.

Note that the P-type semiconductor region 106 formed around the insulator region 110 is formed by a process different from that of the P-type semiconductor region 107 on the front surface S1 of the substrate 100. The impurity concentration and ion species may be different between the P-type semiconductor region 107 and the P-type semiconductor region 106. Furthermore, the P-type semiconductor region 107 and the P-type semiconductor region 106 may be formed apart from each other.

The transistor region 113 is a region in which a transistor (TR1, TR2, TR3) constituting a circuit of the pixel 1C is formed. In the present embodiment, an example in which three N-type transistors are arranged in one pixel 1C will be described. The transistor region 113 includes a P-type well region 108 and an N-type source region or drain region (collectively referred to as an electrode region 109) formed in the well region 108. The range of the well region 108 in a plan view can be referred to as a transistor region 113.

In addition, the gate electrode 114 and the like are formed over the front surface S1 of the substrate 100 in the transistor region 113 via the gate oxide film 112. The operation of the transistor formed in the transistor region 113 will be described below.

A bottom surface of the P-type well region 108 is defined as a bottom surface S3 (FIG. 1C). In the present embodiment, a portion inside the transistor region 113 and deeper than the bottom surface S3 of the well region 108 in a plan view is the charge generation region 104 and is included in a sensitive region of the pixel 1C. The transistor region 113 is arranged for each pixel 1C, but the position of the transistor region 113 may straddle the boundary of the pixel 1C as illustrated in FIGS. 1A and 1C. That is, one continuous transistor region 113 may be in a positional relationship of overlapping the charge generation regions 104 of two or more pixels 1C in a plan view.

The interlayer insulating film 115 is an insulating film formed above the substrate 100 and the gate oxide film 112. The interlayer insulating film 115 can be formed as a silicon oxide film thicker than the gate oxide film 112 by a Chemical Vapor Deposition (CVD) method or the like.

Figure 2A:
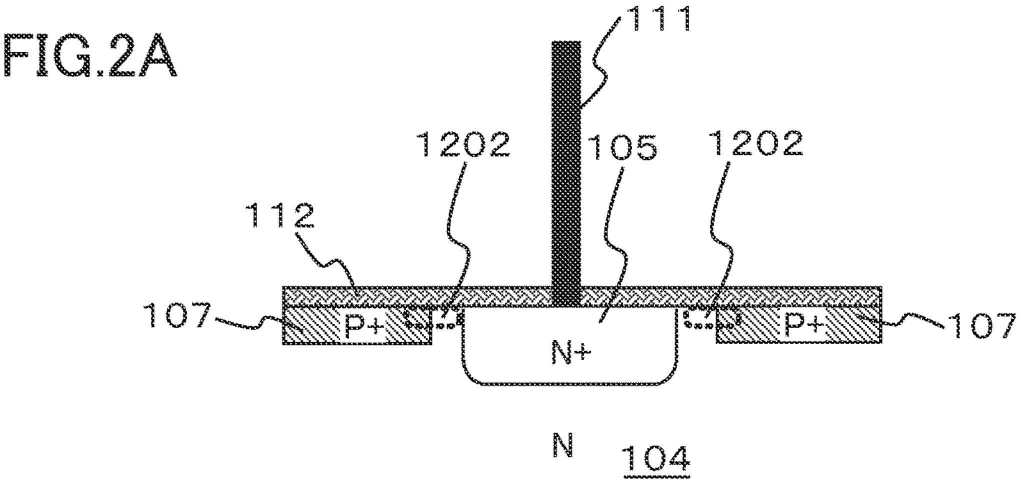
FIG. 2A is a cross-sectional view illustrating a pixel structure according to a comparative example.
Figure 2B:
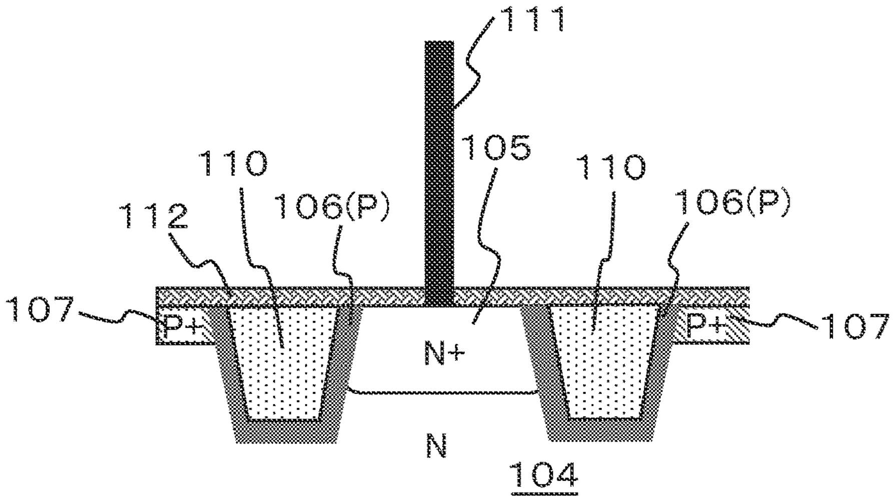
FIG. 2B is a cross-sectional view illustrating the pixel structure according to the first embodiment.
Figure 2C:
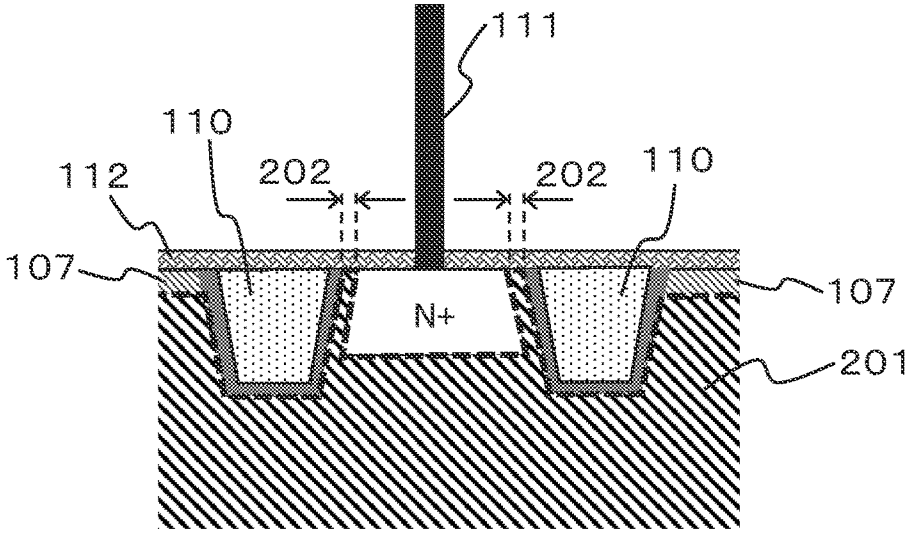
FIG. 2C is a cross-sectional view illustrating the pixel structure according to the first embodiment.

A structure in the vicinity of the charge collection region 105 will be described with reference to FIGS. 2A to 2C. FIG. 2A is a cross-sectional view illustrating a comparative example of a structure in which the insulator region 110 is omitted from the imaging device 1 of the present embodiment. FIG. 2B is a cross-sectional view illustrating the structure of the conversion element portion PD according to the present embodiment. FIG. 2C is a diagram illustrating the spread of the depletion layer in the structure illustrated in FIG. 2B.

First, an increase in dark current noise due to radiation exposure will be described. In general, the dark current increases in proportion to the number of defects in the depletion layer that is the sensitive region. In addition, since there is a defect at the interface where the semiconductor substrate and the insulating film covering the surface of the semiconductor substrate are in contact with each other, when the depletion layer is in contact with the interface between the semiconductor substrate and the insulating film, the dark current is likely to increase.

Here, as the total dose effect of radiation, it is known that a defect level of the insulating film is increased by radiation exposure. In addition, even in the same insulator, since the gate oxide film 112 is closer to the wiring layer than the insulator region 110, an increase in the defect level at the interface of the gate oxide film 112 tends to lead to an increase in dark current. That is, when the depletion layer, which is the sensitive region of the pixel 1C, is in contact with the gate oxide film 112 covering the front surface S1 of the substrate 100, an increase in the dark current noise due to the radiation exposure is more likely to occur. An increase in dark current noise in the imaging device 1 may lead to a decrease in image quality or a decrease in a dynamic range.

As illustrated in FIG. 2A, in the comparative example, a part of the charge generation region 104 is exposed on the front surface S1 of the substrate 100, and the P-type semiconductor region 107 and the charge generation region 104 form a PN junction on the front surface S1. Therefore, in the comparative example, the depletion layer 1202 spreads along the front surface S1 of the substrate 100 from the PN junction of the P-type semiconductor region 107 and the charge generation region 104.

According to the study of the inventors, it has been found that the larger the contact area between the depletion layer 1202 and the gate oxide film 112 on the front surface S1 of the substrate 100, the more remarkable the increase in dark current noise due to radiation exposure becomes. That is, it has been found that an increase in dark current noise due to radiation exposure can be reduced by reducing the contact area between the depletion layer 1202 and the gate oxide film 112.

Note that, in the comparative example, it was also studied to reduce the spread of the depletion layer 1202 on the front surface S1 by bringing the P-type semiconductor region 107 closer to the charge collection region 105 having an impurity concentration higher than that of the charge generation region 104 on the front surface S1 of the substrate 100. However, when the P-type semiconductor region 107 is brought close to the charge collection region 105, it is difficult to secure a withstand voltage, and a phenomenon in which the frequency of occurrence of white flaws increases has been observed. Here, the white flaw means a defective pixel (so-called hot pixel) in which a pixel signal is always ON even in a dark state.

Therefore, in the present embodiment, as illustrated in FIG. 2B, the insulator region 110 is disposed, in the front surface S1 of the substrate 100, between the charge collection region 105, which is an N-type semiconductor region, and the P-type semiconductor region 107.

A depletion layer 201 in FIG. 2C represents a depletion layer extending in the N-type region and the P-type region in the substrate 100, and a thick dotted line represents a boundary between the depletion layer 201 and a neutral region. Most of the depletion layer 201 is the charge generation region 104 surrounded by a P-type region.

The imaging device 1 of the present embodiment has a structure in which the insulator region 110 is interposed between the charge collection region 105 and the P-type semiconductor region 107 on the front surface S1 of the substrate 100. In other words, when viewed in a direction perpendicular to the front surface S1 of the substrate 100, the insulator region 110 is located between the charge collection region 105 (first semiconductor region) and the P-type semiconductor region 107 (second semiconductor region) in at least one direction. The "at least one direction" is not particularly limited, and is, for example, the A-A' direction or the B-B' direction in FIG. 1A in the case of the present embodiment.

With this configuration, it is possible to prevent the depletion layer 201 from spreading along the front surface S1 of the substrate 100 between the charge collection region 105 (first semiconductor region) and the P-type semiconductor region 107 (second semiconductor region). That is, the contact area between the depletion layer 201 and the gate oxide film 112 can be reduced. Therefore, even when defects at the interface of the gate oxide film 112 increase due to the radiation exposure, the increase in the dark current can be suppressed, and the increase in the dark current noise in the imaging device 1 can be reduced.

That is, according to the present embodiment, it is possible to provide the detector and the detection system capable of reducing the increase in the dark current noise due to the radiation exposure.

In addition, in the present embodiment, the charge collection region 105 (first semiconductor region) is disposed in a region separated from the P-type semiconductor region 107 by the insulator region 110 in a plan view (FIG. 1A) of the substrate 100. Therefore, the contact area between the depletion layer 201 and the gate oxide film 112 on the substrate surface can be further reduced. Note that, as described above, in the present embodiment, the transistors constituting the readout circuit of the pixel 1C are disposed in the region separated from the P-type semiconductor region 107 by the insulator region 110. As a result, the insulator region 110 can have a function of separating the active region of the transistor from the P-type semiconductor region 107.

Meanwhile, in the present embodiment, since the P-type semiconductor region 106 is provided around the insulator region 110, the depletion layer 201 may be formed between the charge collection region 105 and the P-type semiconductor region 106. That is, on the front surface S1 of the substrate 100, there may be a contact region 202 where the depletion layer 201 and the gate oxide film 112 are in contact with each other. However, the impurity concentration of the charge collection region 105 is higher than the impurity concentration of the charge generation region 104. Therefore, as compared with the comparative example in which the charge generation region 104 and the P-type semiconductor region 106 form a PN junction on the front surface S1 of the substrate 100, the expansion of the depletion layer 201 on the front surface S1 can be suppressed, and the contact region 202 between the depletion layer 201 and the gate oxide film 112 can be reduced.

The small contact region 202 between the depletion layer 201 and the gate oxide film 112 will be described from another viewpoint. In general, the depletion layer spreads from the PN junction toward both the P-type region and the N-type region so that the total amount of space charges of the P-type and the total amount of space charges of the N-type becomes equal. In the present embodiment, the insulator region 110 exists in the vicinity of a portion where the P-type semiconductor region 106 and the charge collection region 105 are in contact with each other. Therefore, the P-type depletion layer does not extend beyond the insulator region 110. As a result of suppressing the spread of the P-type depletion layer, the spread of the N-type depletion layer 201 is also limited. Therefore, the width of the contact region 202 where the N-type depletion layer 201 and the gate oxide film 112 are in contact with each other on the front surface S1 of the substrate 100 is suppressed.

In the above, the description has been given focusing on the spread of the N-type depletion layer 201, but actually, the depletion layer spreading in the P-type region may also affect the dark current noise. The above description can be said to be an approximate description assuming a case where the impurity concentration of the P-type semiconductor region 106 is sufficiently high or a case where the P-type semiconductor region 106 is sufficiently narrow. However, even in a case where the P-type depletion layer is taken into consideration, the extension of the depletion layer on the front surface S1 of the substrate 100 can be suppressed by providing the insulator region 110, and the contact region 202 with the gate oxide film 112 can be reduced.

As described above, the P-type semiconductor region 106 at the interface of the insulator region 110 functions as a channel stopper layer. Therefore, as compared with a case where the insulator region 110 is simply provided, the withstand voltage between the P-type semiconductor region 107 and the charge collection region 105 is increased, and the occurrence of white flaws can be more effectively suppressed.

Meanwhile, as described above, since the impurity concentration of the P-type semiconductor region 106 is higher than the impurity concentration of the charge generation region 104, the P-type depletion layer spreading from the PN junction of the P-type semiconductor region 106 and the charge generation region 104 is not in contact with the insulator region 110. Therefore, even when the number of defects at the interface of the insulator region 110 increases due to radiation exposure, the increase in the dark current noise caused by the defect at the interface of the insulator region 110 can be suppressed.

That is, according to the present embodiment, by providing the P-type semiconductor region 106 at the interface with the insulator region 110, it is possible to suppress the occurrence of white flaws and further reduce the increase in the dark current noise due to radiation exposure.

Note that the impurity concentration of the charge collection region 105 (N-type) may be higher than the P-type impurity concentration implanted to form the P-type semiconductor region 106. In this case, a region (a region where the charge collection region 105 and the P-type semiconductor region 106 overlap) near the insulator region 110 on the charge collection region 105 side is substantially an N-type region. As a result, in FIG. 2C, the depletion layer 201 is not formed between the charge collection region 105 and the P-type semiconductor region 106 on the front surface S1 of the substrate 100, and the depletion layer 201 is not in contact with the gate oxide film 112. That is, in this case, since the depletion layer 201 is formed only inside the substrate 100 and is not in contact with the gate oxide film 112, the increase in the defects at the interface of the gate oxide film 112 due to the radiation exposure does not lead to the increase in the dark current noise.

There is another advantage of the present embodiment. A defect at the gate oxide film 112 interface may be present in the initial state by the manufacturing process. Therefore, according to the present embodiment, the dark current noise in the initial state can also be suppressed.

Furthermore, the concentration of each semiconductor region can be designed such that at least a part (preferably the entire part) of the charge generation region 104 is always substantially depleted (completely depleted) during imaging by the imaging device 1. In this case, it is possible to suppress a phenomenon in which the capacitance of the depletion layer contributing to detection fluctuates depending on a voltage operating range of the charge collection region 105. As one preferable embodiment, the above advantages can be obtained by performing concentration design in which the charge generation region 104 becomes completely depleted in a state where no external voltage is applied thereto, i.e., at the built-in potential. As a result, gain fluctuation due to the operating point of the charge collection region 105 can be suppressed. In addition to the advantage of improving the linearity of the output signal with respect to the amount of generated charges, this also provides an advantage of being able to suppress gain fluctuation accompanying the increase in the dark current noise due to the total dose effect caused by the radiation exposure, that is, fluctuation in sensitivity due to deterioration.

The relationship between the depth of each semiconductor region (104, 105, 106, 107) and the depth of the insulator region 110 will be described with reference to FIG. 2B.

With the front surface S1 of the substrate 100 as a reference, the insulator region 110 is preferably formed up to a position deeper than the P-type semiconductor region 107. As a result, the P-type semiconductor region 107 and the charge collection region 105 can be more deeply separated, and the increase in the dark current noise can be more reliably reduced.

For the same reason, with reference to the front surface S1 of the substrate 100, the insulator region 110 may be formed to a position deeper than the charge collection region 105. However, the charge collection region 105 may be formed to a position deeper than the insulator region 110. In this case, the efficiency of collecting signal charges generated in a region farther than the insulator region 110 in the direction along the front surface S1 with respect to the charge collection region 105 in the charge generation region 104 as a reference to the charge collection region 105 can be improved.

Furthermore, according to the present embodiment, the area on the planar layout of the charge collection region 105 is defined by the insulator region 110. Therefore, even when the impurities are diffused by heat during the manufacturing process, it is possible to suppress the area of the charge collection region 105 from expanding. Therefore, it is also possible to obtain an effect of reducing the junction capacitance. Details of an advantage of the function capable of reducing the junction capacitance will be described in the second embodiment.

Figure 3:
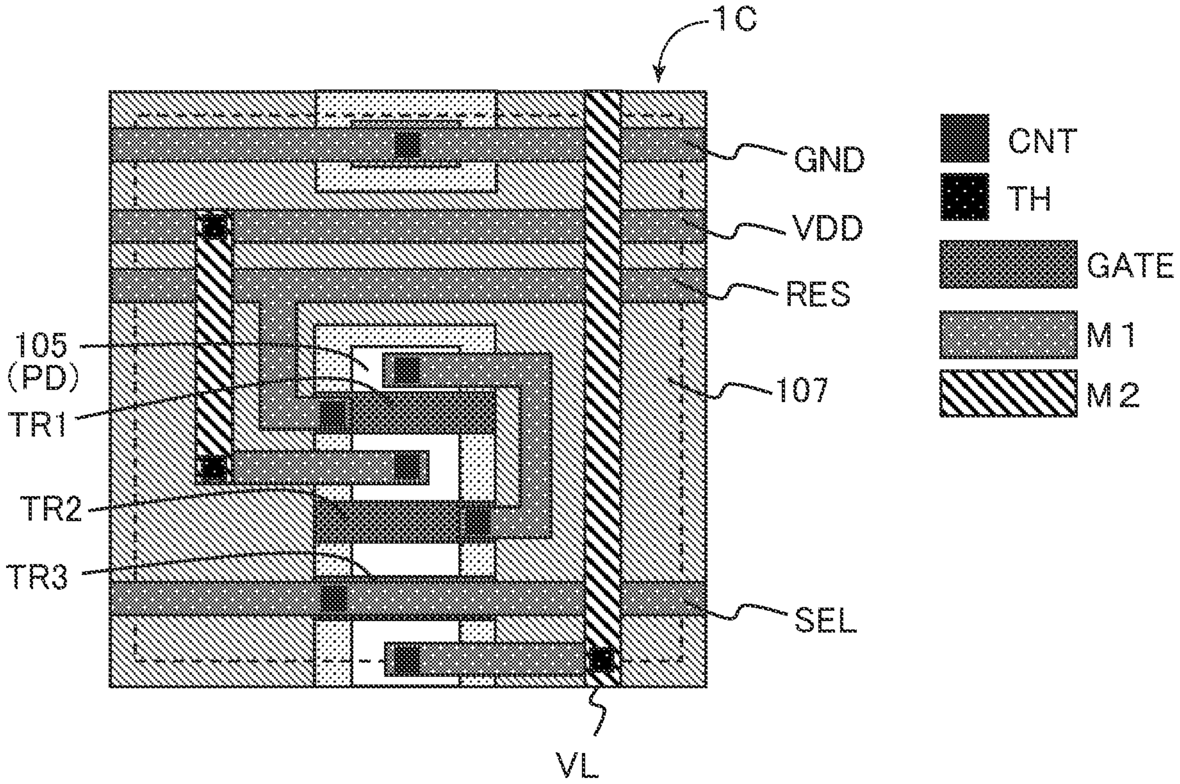
FIG. 3 is a diagram in which wiring is added to FIG. 1A.
Figure 4:
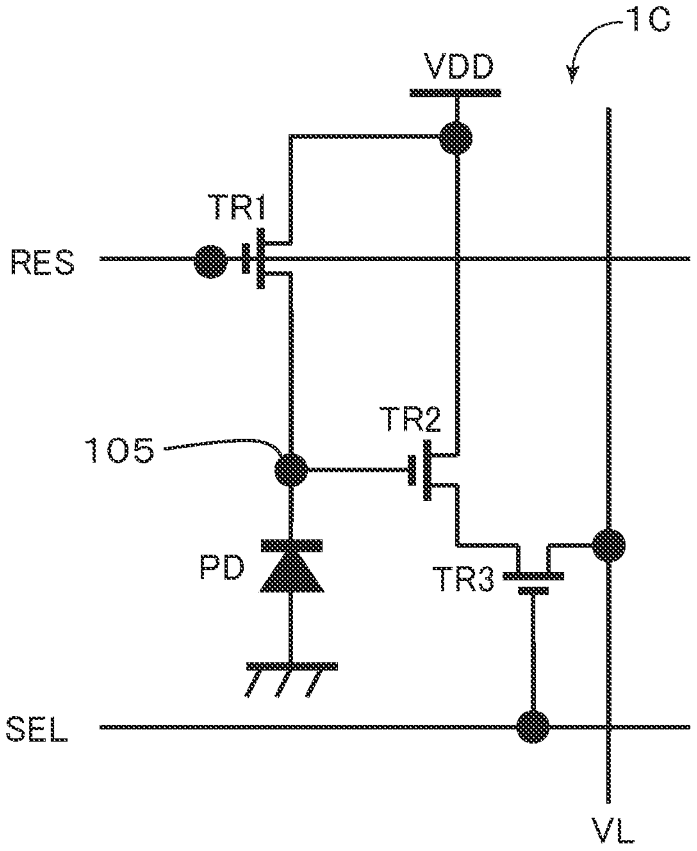
FIG. 4 is a circuit diagram showing a pixel circuit according to the first embodiment.

FIG. 3 illustrates a circuit structure of one pixel 1C, and is a plan view in which a wire is added to the structure illustrated in FIG. 1A. FIG. 4 is a circuit diagram corresponding to the circuit structure of FIG. 3.

As illustrated in FIGS. 3 and 4, each pixel 1C includes a conversion element portion PD, a reset transistor TR1, an amplification transistor TR2, and a selection transistor TR3. The charge collection region 105 of the conversion element portion PD is an electrode that collects signal charges generated in the charge generation region 104 of the conversion element portion PD upon incidence of an energy ray. The reset transistor TR1 resets the signal charge of the charge generation region 104 via the charge collection region 105. The amplification transistor TR2 outputs a signal based on an amount of signal charges output from the conversion element portion PD. The selection transistor TR3 outputs the output from the amplification transistor TR2 to the vertical signal line VL.

The voltages applied from outside to drive the transistors (TR1 to TR3) are referred to as RES, VDD, SEL, and GND voltages. The RES voltage is applied to the gate terminal of the reset transistor TR1, a VDD voltage is applied to the drain terminals of the reset transistor TR1 and the amplification transistor TR2, and a SEL voltage is applied to the gate terminal of the selection transistor TR3. The charge collection region 105 of the conversion element portion PD is a source region of the reset transistor TR1.

Note that the type of voltage and the connection relationship are merely examples, and are not limited thereto. In addition, in FIG. 3, a structure equivalent to the circuit of FIG. 4 via a wire M1 of a first wiring layer, a wire M2 of a second wiring layer, a contact CNT, and a through-hole TH is illustrated, but the circuit of FIG. 4 may be realized by using wires of a higher layer such as a wire M3 and a wire M4, for example.

The charge collection region 105 and the gate of the amplification transistor TR2 are electrically connected, and a signal voltage corresponding to the amount of signal charges of the charge collection region 105 is output from the source of the amplification transistor TR2. The source of the amplification transistor TR2 and the drain of the selection transistor TR3 are common, and the signal voltage is output from the source of the selection transistor TR3 at the timing when the SEL voltage is applied, and is read out to a peripheral circuit via the vertical signal line VL. In a case where the signal charge of the charge generation region 104 is reset, the RES voltage is applied to the gate voltage of the reset transistor TR1.

Figure 5:
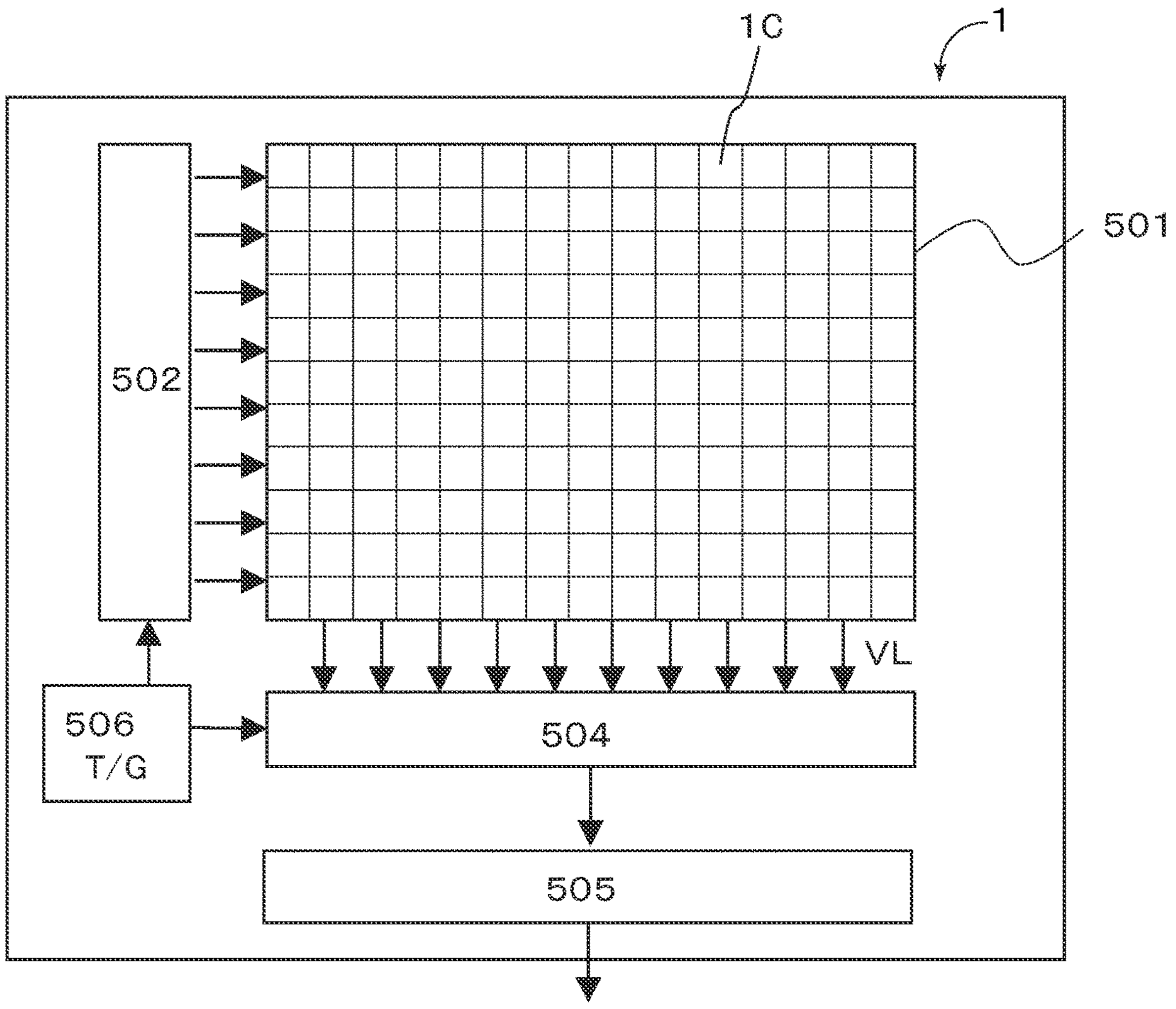
FIG. 5 is a block diagram illustrating a configuration of an imaging device according to the first embodiment.

FIG. 5 is a block diagram illustrating a configuration example of the imaging device 1. The imaging device 1 includes a pixel array 501 in which the pixels 1C illustrated in FIGS. 1A to 1C are arranged in a two-dimensional matrix, a vertical scanning circuit 502, vertical signal lines VL, a column circuit 504, a DFE 505, and a timing generator (T/G) 506. Here, DFE is an abbreviation of Digital Front End.

Under the control of the SEL voltage or the RES voltage, the vertical scanning circuit 502 selects a pixel row from which a signal is to be output in the pixel array 501 and sequentially operates the pixel rows. A signal (pixel signal) is input to one of the vertical signal lines VL from a pixel selected by the vertical scanning circuit 502. The column circuit 504 processes signals input from the vertical signal lines VL. The DFE 505 outputs the signal input from the column circuit 504 to outside of the imaging device 1. A timing generator (T/G) 506 controls timing of circuit operation of the vertical scanning circuit 502 and the column circuit 504.

Note that, although FIG. 5 illustrates the imaging device 1 including the pixel array 501 arranged in a two-dimensional matrix, the detector of the present disclosure may include a pixel region in which a plurality of pixels 1C is arranged in a one-dimensional linear array, depending on the application.

Second Embodiment

A second embodiment of the present disclosure will be described. Hereinafter, elements denoted by the same reference numerals as those in the first embodiment have substantially the same configurations and functions as those described in the first embodiment unless otherwise specified, and portions different from those in the first embodiment will be mainly described.

Figure 6A:
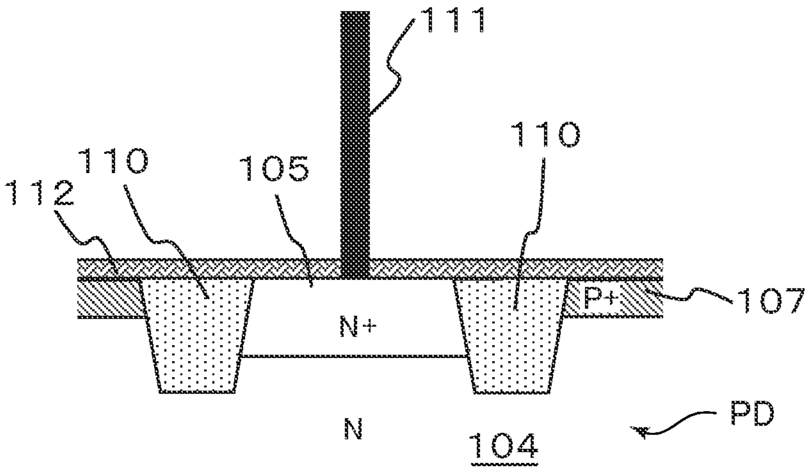
FIG. 6A is a cross-sectional view illustrating a pixel structure according to a second embodiment.
Figure 6B:
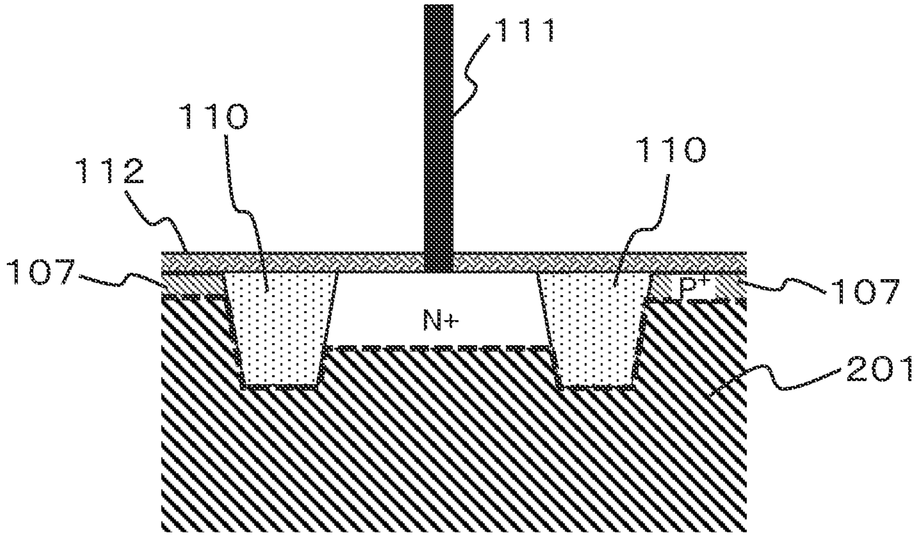
FIG. 6B is a cross-sectional view illustrating the pixel structure according to the second embodiment.

FIG. 6A is a cross-sectional view illustrating a structure of a conversion element portion PD according to a second embodiment. FIG. 6B is a diagram illustrating a spread of a depletion layer in the structure illustrated in FIG. 6A.

As illustrated in FIGS. 6A and 6B, in the second embodiment, the P-type semiconductor region 106 (see FIG. 2B of the first embodiment) around the insulator region 110 is not provided. Therefore, the charge collection region 105 (first semiconductor region) and the charge generation region 104 (third semiconductor region) are in contact with the interface of the insulator region 110.

As described above, in the second embodiment, the P-type semiconductor region 107 and the charge collection region 105 are separated by the insulator region 110. Therefore, a withstand voltage between the P-type semiconductor region 107 and the charge collection region 105 can be secured, and the occurrence of white flaws can be suppressed.

In addition, in the second embodiment, since the charge collection region 105 is separated from the P-type semiconductor region in the substrate 100, the junction capacitance can be reduced. In practice, a detected capacitance is the sum of the junction capacitance and a parasitic capacitance between the wires. The junction capacitance depends on the operating point, but an insulating layer capacitance, which is a main factor of the parasitic capacitance between the wires, does not depend on the operating point. Therefore, also in the present embodiment, it is possible to suppress gain fluctuation due to an operating point and gain fluctuation due to deterioration.

In the second embodiment, since the P-type semiconductor region is not provided around the insulator region 110, the PN junction is not formed on the side of the charge collection region 105 with respect to the insulator region 110. Therefore, on the front surface S1 of the substrate 100, there is no contact region 202 where the depletion layer 201 and the gate oxide film 112 are in contact with each other as in the first embodiment (FIG. 2C). Therefore, even when the defects at the gate oxide film 112 interface due to the radiation exposure increase, the increase in the dark current noise can be reduced.

That is, according to the present embodiment, it is possible to provide the detector and the detection system capable of reducing the increase in the dark current noise due to the radiation exposure.

Third Embodiment

A third embodiment of the present disclosure will be described. Hereinafter, elements denoted by the same reference numerals as those in the first embodiment have substantially the same configurations and functions as those described in the first embodiment unless otherwise specified, and portions different from those in the first embodiment will be mainly described.

Figure 7A:
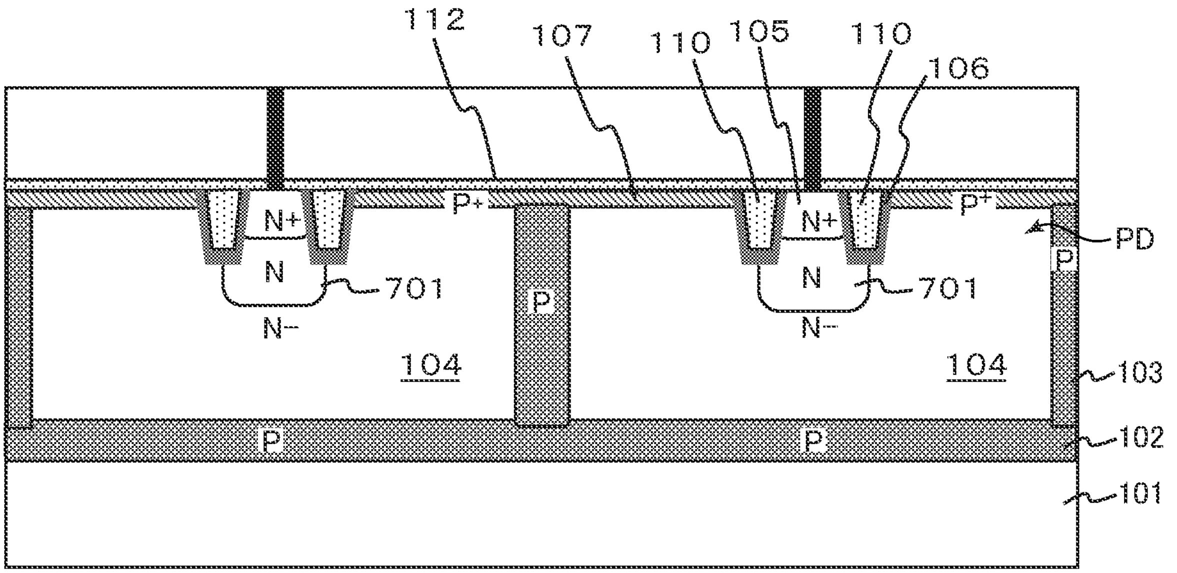
FIG. 7A is a cross-sectional view illustrating a pixel structure according to a third embodiment.
Figure 7B:
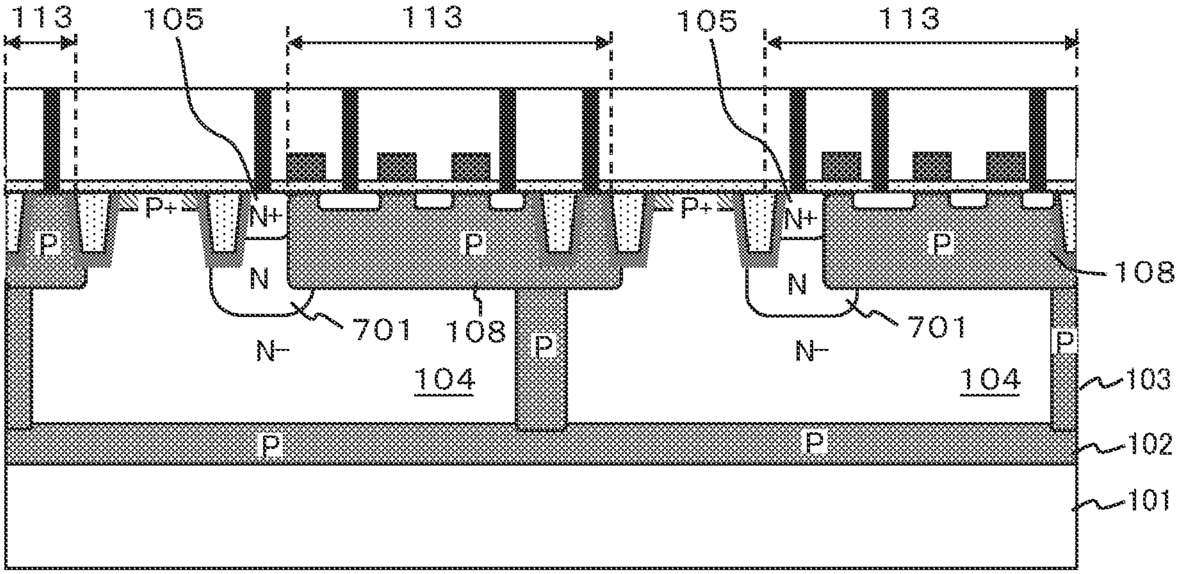
FIG. 7B is a cross-sectional view illustrating the pixel structure according to the third embodiment.

FIGS. 7A and 7B are diagrams illustrating a part of an imaging device 1 as a detector according to a third embodiment. A planar layout of the pixel 1C of the imaging device 1 according to the present embodiment is similar to that of the first embodiment (FIG. 1A), and thus is omitted. FIG. 7A is a cross-sectional view corresponding to the A-A' cross section of FIG. 1A. FIG. 7B is a cross-sectional view corresponding to the B-B' cross section of FIG. 1A.

As illustrated in FIGS. 7A and 7B, in the third embodiment, an N-type semiconductor region 701 (fifth semiconductor region) is additionally provided as compared with the first embodiment. The N-type semiconductor region 701 is formed between the charge collection region 105 (first semiconductor region) and the charge generation region 104 (third semiconductor region) in the depth direction of the substrate 100.

The charge collection region 105, the charge generation region 104, and the N-type semiconductor region 701 are all N-type regions. The impurity implantation amount of each region is set such that the charge collection region 105 (N+), the N-type semiconductor region 701 (N), and the charge generation region 104 (N−) are arranged in this order from the higher impurity concentration.

Due to the potential gradient formed by such an impurity concentration difference, signal charges generated in the charge generation region 104 can be more efficiently collected in the charge collection region 105. When the signal charge collection efficiency is improved, the area of the charge collection region 105 in the planar layout (FIG. 1A) of the front surface S1 of the substrate 100 can be further reduced while maintaining the performance of the conversion element portion PD. As a result, the contact area between the charge collection region 105 and the gate oxide film 112 can be reduced, and for example, the contact area between the depletion layer spreading from the junction between the charge collection region 105 and the P-type semiconductor region 106 around the insulator region 110 and the gate oxide film 112 is also reduced. Therefore, according to the present embodiment, it is possible to further reduce the increase in the dark current noise due to the radiation exposure.

In FIG. 7B, the N-type semiconductor region 701 is formed to a position deeper than both the insulator region 110 and the well region 108 of the transistor region 113, but the configuration is not limited thereto. The N-type semiconductor region 701 may be formed up to a position shallower than the well region 108 of the insulator region 110 and/or the transistor region 113.

Fourth Embodiment

A fourth embodiment of the present disclosure will be described. Hereinafter, elements denoted by the same reference numerals as those in the first embodiment have substantially the same configurations and functions as those described in the first embodiment unless otherwise specified, and portions different from those in the first embodiment will be mainly described.

Figure 8:
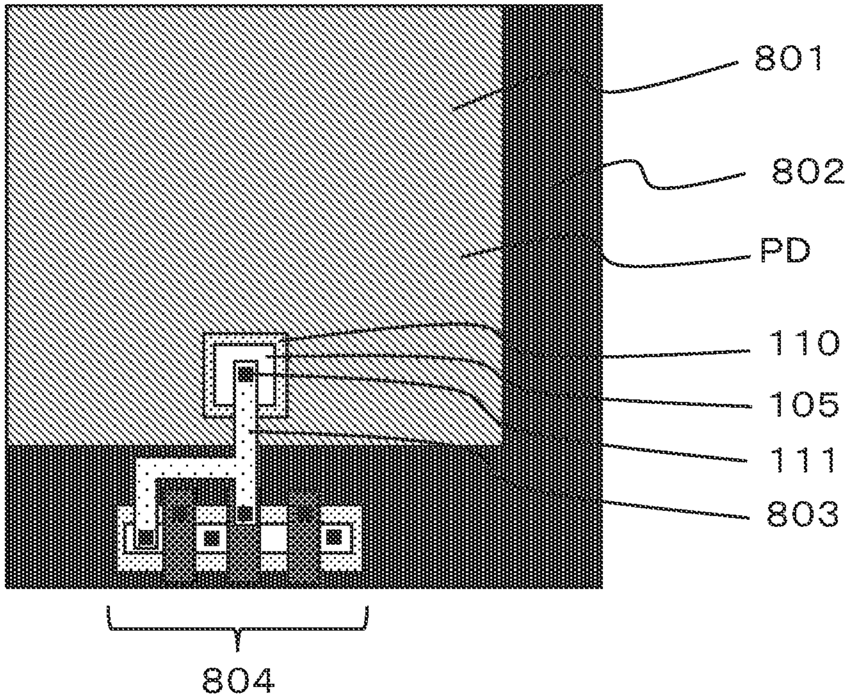
FIG. 8 is a plan view illustrating a pixel structure according to a fourth embodiment.

FIG. 8 is a plan view illustrating a planar layout of the pixel 1C included in the imaging device 1 of the fourth embodiment. In the fourth embodiment, one pixel 1C includes two regions (801, 802) separated from each other in a plan view.

The sensitivity region 801 is a region (region where the conversion element portion PD is formed) that generates a signal charge by being irradiated with an energy ray. The sensitivity region 801 has a cross-sectional structure similar to that in FIG. 2B. That is, the sensitivity region 801 includes the charge collection region 105 and the P-type semiconductor region 107 formed on the front surface S1, and the charge generation region 104 formed under the charge collection region 105 and the P-type semiconductor region 107. The insulator region 110 is formed on the front surface S1 of the sensitivity region 801. The P-type semiconductor region 106 can be formed at the interface of the insulator region 110 of the substrate 100. The insulator region 110 is preferably formed so as to surround the entire periphery of the charge collection region 105 in a plan view.

In the circuit region 802, at least one transistor (for example, the transistors (TR1 to TR3) described with reference to FIGS. 3 and 4) constituting the readout circuit 804 that reads a signal from the pixel 1C is arranged. That is, in the present embodiment, the transistors constituting the readout circuit 804 are arranged outside the charge generation region 104 (third semiconductor region) in a plan view of the substrate 100. The charge collection region 105 is connected to the readout circuit via the contact 111 and a wire 803 of the wiring layer. As a result, the signal charge converted from the energy ray in the sensitivity region 801 can be read by the readout circuit 804.

In the above-described embodiment, the gate electrode 114 (see FIG. 1A) of the transistor constituting the readout circuit is located in a part of the periphery of the charge collection region 105 in a plan view. In the present embodiment, the entire periphery of the charge collection region 105 is surrounded by the insulator region 110 in a plan view.

Also in the configuration of the present embodiment, since the insulator region 110 is located between the charge collection region 105 (first semiconductor region) and the P-type semiconductor region 107 (second semiconductor region) in a plan view, it is possible to prevent the depletion layer 201 from spreading along the front surface S1 of the substrate 100. That is, the contact area between the depletion layer 201 and the gate oxide film 112 can be reduced. Therefore, even when defects at the interface of the gate oxide film 112 increase due to the radiation exposure, the increase in the dark current can be suppressed, and the increase in the dark current noise in the imaging device 1 can be reduced.

Fifth Embodiment

As a fifth embodiment, a radiation imaging system 900 as an example of a detection system including a detector will be described with reference to FIG. 9.

Figure 9:
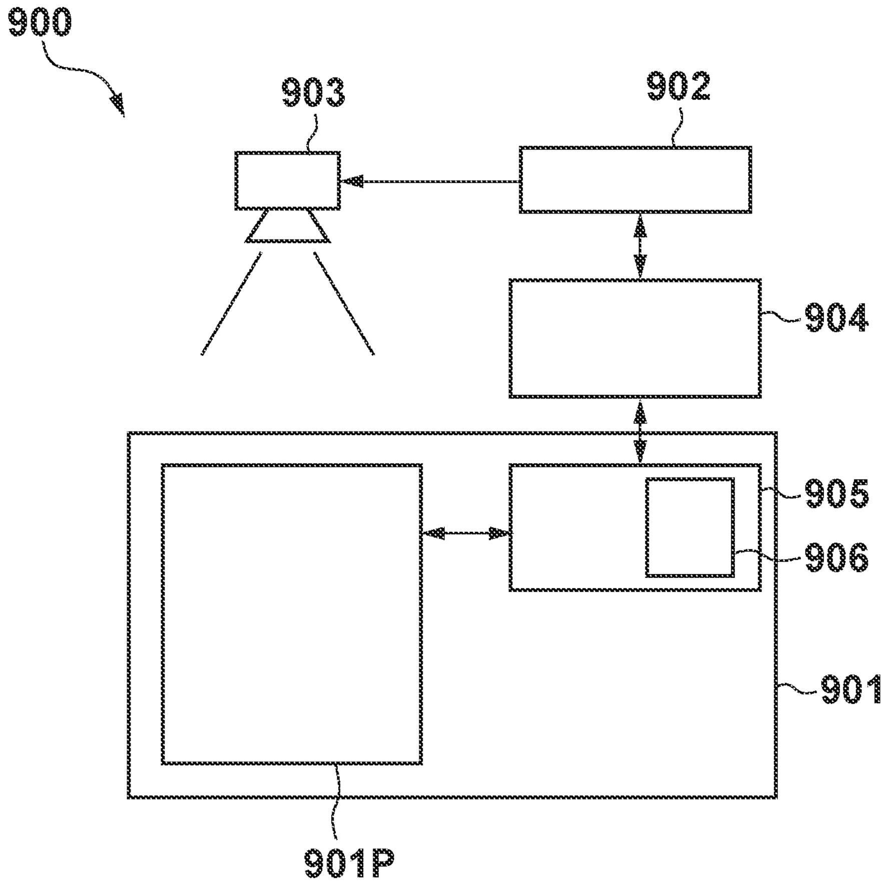
FIG. 9 is a schematic diagram of a radiation imaging system according to a fifth embodiment.

The radiation imaging system 900 illustrated in FIG. 9 includes a radiation imaging apparatus 901, an exposure control unit 902, a radiation source 903, and a computer 904. The radiation source 903 is an example of an irradiation unit that irradiates an object with radiation (for example, X-rays) as energy rays. The radiation imaging apparatus 901 includes an imaging panel 901P in which the pixel structures described in the first to fourth embodiments are arranged in a two-dimensional matrix, for example, as a detector that detects energy rays.

The imaging panel 901P may be a direct-conversion type radiation detector that directly converts radiation into signal charges. Furthermore, the imaging panel 901P may be an indirect conversion type radiation detector that converts radiation into fluorescence by a scintillator and directly converts fluorescence into signal charges.

The radiation source 903 starts radiation irradiation in accordance with the exposure command from the exposure control unit 902. The radiation emitted from the radiation source 903 passes through the imaging target (an object to be tested) and enters the imaging panel 901P of the radiation imaging apparatus 901. The radiation source 903 stops radiation in accordance with the stop command from the exposure control unit 902.

The radiation imaging apparatus 901 is, for example, a flat panel detector used for radiographing in medical image diagnosis, non-destructive inspection, or the like. The imaging panel 901P of the radiation imaging apparatus 901 can have a plate shape having a size corresponding to the size of the imaging target.

The radiation imaging apparatus 901 includes the above-described imaging panel 901P, a control unit 905 for controlling the imaging panel 901P, and a signal processing unit 906 for processing a signal output from the imaging panel 901P. For example, the signal processing unit 906 performs A/D conversion on a signal output from the imaging panel 901P, and outputs the converted signal to the computer 904 as digital image data. Furthermore, the signal processing unit 906 may generate a stop signal for stopping irradiation of radiation from the radiation source 903 on the basis of a signal output from the imaging panel 901P, for example. The stop signal is supplied to the exposure control unit 902 via the computer 904, and the exposure control unit 902 transmits a stop command to the radiation source 903 in response to the stop signal.

The control unit 905 can be configured by, for example, a PLD such as an FPGA, a general-purpose computer in which an ASIC or a program is incorporated, or a combination of all or one unit thereof. Here, FPGA is an abbreviation of a Field Programmable Gate Array. PLD is an abbreviation of a Programmable Logic Device. ASIC is an abbreviation of an Application Specific Integrated Circuit.

The computer 904 can perform control of the radiation imaging apparatus 901 and the exposure control unit 902, and processing for receiving radiation image data from the radiation imaging apparatus 901 and displaying the radiation image data as a radiation image. In addition, the computer 904 can function as an input unit for the user to input conditions for capturing a radiation image.

As an example, the exposure control unit 902 includes an exposure switch. When the exposure switch is turned on by the user, the exposure control unit sends an exposure command to the radiation source 903 and also sends a start notification indicating the start of radiation emission to the computer 904. The computer 904 that has received the start notification notifies the control unit 905 of the radiation imaging apparatus 901 of the start of irradiation of radiation in response to the start notification. In response to this, the control unit 905 causes the imaging panel 901P to generate a signal corresponding to the incident radiation.

OTHER EMBODIMENTS

In each of the above-described embodiments, the detector configured to be irradiated with the energy rays to be detected from a source disposed on the side of the front surface S1 with respect to the substrate 100 (the main surface on the side where the charge collection region 105 and the like are disposed) has been described. The configuration is not limited to thereto, and the detector of the present disclosure may be configured such that the energy rays to be detected are emitted from a source disposed on the back surface S2 side with respect to the substrate 100.

Furthermore, the radiation imaging system 900 described in the fifth embodiment is merely an example of a detection system including a detector, and the detector having the pixel structure described in the present disclosure may be applied to a detection system for another application. Examples of such a detection system include, but are not limited to, a radiation diagnosis apparatus that uses X-rays to see through the body of a patient, an analysis device that uses X-rays to analyze a sample, and an electron microscope that uses an electron beam to image a sample.

Although the plurality of embodiments have been described above, the configurations of the embodiments can be appropriately combined.

According to the present disclosure, it is possible to provide a detector and a detection system capable of reducing an increase in dark current noise due to radiation exposure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-017435 filed on Feb. 8, 2023, which is hereby incorporated by reference herein in its entirety.

What is claimed is:

1. A detector comprising:

a substrate;

a transistor constituting a part of a circuit configured to read a signal charge; and an insulating film formed over a main surface of the substrate, wherein the substrate includes:

a conversion element portion configured to convert an energy ray into the signal charge; and an insulator region disposed in a recess portion of the main surface, wherein the conversion element portion includes:

a first semiconductor region that is formed on the main surface and is of a first conductivity type in which charges of a same polarity as the signal charge are used as majority carriers;

a second semiconductor region that is formed on the main surface and is of a second conductivity type different from the first conductivity type; and a third semiconductor region that is formed under the first semiconductor region and the second semiconductor region, is of the first conductivity type, and has an impurity concentration lower than an impurity concentration of the first semiconductor region, wherein in a plan view with respect to the main surface, the insulator region is located between the first semiconductor region and the second semiconductor region in at least one direction, wherein in the plan view, the first semiconductor region is disposed in a region separated from the second semiconductor region by the insulator region, wherein the transistor is disposed inside the third semiconductor region in the plan view, and wherein in the plan view, the first semiconductor region and an active region of the transistor are disposed in the region separated from the second semiconductor region by the insulator region.

2. The detector according to claim 1, further comprising:

a gate electrode formed above the insulating film, the gate electrode constituting a transistor having the first semiconductor region as a source or a drain, wherein in the plan view, the first semiconductor region is surrounded by the insulator region and the gate electrode.

3. The detector according to claim 2, wherein the transistor having the first semiconductor region as the source or the drain is a reset transistor configured to reset the signal charge of the conversion element portion, and wherein the first semiconductor region is a source region of the reset transistor.

4. The detector according to claim 1, wherein the first semiconductor region is in contact with the insulator region.

5. The detector according to claim 1, wherein at least a part of the third semiconductor region is configured to be depleted in a state where no external voltage is applied.

6. The detector according to claim 1, wherein the conversion element portion further includes a fifth semiconductor region that is formed below the first semiconductor region and above the third semiconductor region and is of the first conductivity type, and wherein an impurity concentration of the fifth semiconductor region is lower than the impurity concentration of the first semiconductor region and higher than the impurity concentration of the third semiconductor region.

7. The detector according to claim 1, wherein the insulator region is formed up to a position deeper than the second semiconductor region in a depth direction of the substrate with respect to the main surface.

8. The detector according to claim 1, wherein the insulator region is formed up to a position deeper than the first semiconductor region in a depth direction of the substrate with respect to the main surface.

9. The detector according to claim 1, wherein the insulator region is a Shallow Trench Isolation (STI) region or a Local Oxidation of Silicon (LOCOS) region.

10. The detector according to claim 1, wherein the energy ray is a radiation, and wherein the conversion element portion directly converts the radiation into the signal charge.

11. The detector according to claim 1, wherein the energy ray is a radiation, wherein the detector further includes a scintillator configured to emit fluorescence in a case where the radiation is incident, and wherein the conversion element portion is configured to convert the fluorescence into the signal charge.

12. The detector according to claim 1, wherein the energy ray is light, and wherein the conversion element portion is configured to convert the light into the signal charge.

13. A detection system comprising:

an irradiation unit configured to irradiate an object with an energy ray; and the detector according to claim 1, wherein the detector is configured to detect an energy ray incident on the detector from the object.

14. A detector comprising:

a substrate; and an insulating film formed over a main surface of the substrate, wherein the substrate includes:

a conversion element portion configured to convert an energy ray into a signal charge; and an insulator region disposed in a recess portion of the main surface, wherein the conversion element portion includes:

a first semiconductor region that is formed on the main surface and is of a first conductivity type in which charges of a same polarity as the signal charge are used as majority carriers;

a second semiconductor region that is formed on the main surface and is of a second conductivity type different from the first conductivity type; and a third semiconductor region that is formed under the first semiconductor region and the second semiconductor region, is of the first conductivity type, and has an impurity concentration lower than an impurity concentration of the first semiconductor region, wherein in a plan view with respect to the main surface, the insulator region is located between the first semiconductor region and the second semiconductor region in at least one direction, and wherein the substrate further includes a fourth semiconductor region that is formed at an interface of the recess portion in contact with the insulator region and is of the second conductivity type.

15. The detector according to claim 14, wherein an impurity concentration of the fourth semiconductor region is higher than an impurity concentration of the second semiconductor region.

16. A detector comprising:

a substrate; and an insulating film formed over a main surface of the substrate, wherein the substrate includes:

a conversion element portion configured to convert an energy ray into a signal charge; and an insulator region disposed in a recess portion of the main surface, wherein the conversion element portion includes:

a first semiconductor region that is formed on the main surface and is of a first conductivity type in which charges of a same polarity as the signal charge are used as majority carriers;

a second semiconductor region that is formed on the main surface and is of a second conductivity type different from the first conductivity type; and a third semiconductor region that is formed under the first semiconductor region and the second semiconductor region, is of the first conductivity type, and has an impurity concentration lower than an impurity concentration of the first semiconductor region, wherein in a plan view with respect to the main surface, the insulator region is located between the first semiconductor region and the second semiconductor region in at least one direction, and wherein the first semiconductor region is formed up to a position deeper than the insulator region in a depth direction of the substrate with respect to the main surface.

* * * * *